(12) United States Patent
Nakahashi

(10) Patent No.: US 10,958,241 B2
(45) Date of Patent: Mar. 23, 2021

(54) EXTRACTOR

(71) Applicant: Murata Manufacturing Co., Ltd., Nagaokakyo (JP)

(72) Inventor: Norihiko Nakahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 66 days.

(21) Appl. No.: 16/550,585

(22) Filed: Aug. 26, 2019

(65) Prior Publication Data
US 2019/0379353 A1 Dec. 12, 2019

Related U.S. Application Data

(63) Continuation of application No. PCT/JP2018/007842, filed on Mar. 1, 2018.

(30) Foreign Application Priority Data

Mar. 14, 2017 (JP) .............................. JP2017-048268

(51) Int. Cl.
*H03H 9/145* (2006.01)
*H03H 9/64* (2006.01)
(Continued)

(52) U.S. Cl.
CPC ........ *H03H 9/14526* (2013.01); *H03H 9/145* (2013.01); *H03H 9/14552* (2013.01);
(Continued)

(58) Field of Classification Search
CPC ........ H03H 9/6496; H03H 9/145; H03H 9/25; H03H 9/6483; H03H 9/72
(Continued)

(56) References Cited

U.S. PATENT DOCUMENTS

| | | |
|---|---|---|
| 5,663,695 A | 9/1997 | Tanaka et al. |
| 2007/0191055 A1 | 8/2007 | Kovacs et al. |

(Continued)

FOREIGN PATENT DOCUMENTS

| | | |
|---|---|---|
| JP | 51-44852 A | 4/1976 |
| JP | 11-163664 A | 6/1999 |

(Continued)

OTHER PUBLICATIONS

Official Communication issued in International Patent Application No. PCT/JP2018/007842, dated May 15, 2018.

*Primary Examiner* — Benny T Lee
*Assistant Examiner* — Hafizur Rahman
(74) *Attorney, Agent, or Firm* — Keating & Bennett, LLP

(57) ABSTRACT

An extractor includes a band pass filter and a band elimination filter. In the band pass filter, an IDT electrode in at least one of a first series arm resonator and a first parallel arm resonator that are arranged at a series arm and a parallel arm, respectively, closest to a common terminal is a first IDT electrode in which neither a plurality of first electrode fingers nor a plurality of second electrode fingers is partially missing, and an IDT electrode in at least one of the first series arm resonator or the first parallel arm resonator that does not include the first IDT electrode, second series arm resonators, and second parallel arm resonators is a second IDT electrode in which at least one of a plurality of electrode fingers and a plurality of second electrode fingers is partially missing.

19 Claims, 5 Drawing Sheets

(51) Int. Cl.
    *H03H 9/25*     (2006.01)
    *H03H 9/72*     (2006.01)

(52) U.S. Cl.
    CPC ............ *H03H 9/25* (2013.01); *H03H 9/6409* (2013.01); *H03H 9/6483* (2013.01); *H03H 9/6496* (2013.01); *H03H 9/725* (2013.01); *H03H 9/72* (2013.01)

(58) Field of Classification Search
    USPC .......................................................... 333/133
    See application file for complete search history.

(56) References Cited

U.S. PATENT DOCUMENTS

| | | |
|---|---|---|
| 2011/0210805 A1 | 9/2011 | Link et al. |
| 2012/0032753 A1 | 2/2012 | Nishimura et al. |
| 2018/0026605 A1 | 1/2018 | Ito et al. |
| 2018/0123565 A1 | 5/2018 | Takamine |

FOREIGN PATENT DOCUMENTS

| | | |
|---|---|---|
| JP | 2007-511145 A | 4/2007 |
| JP | 2012-501564 A | 1/2012 |
| KR | 10-0207358 B1 | 7/1999 |
| WO | 2010/122786 A1 | 10/2010 |
| WO | 2016/121818 A1 | 8/2016 |
| WO | 2016/208677 A1 | 12/2016 |

EXTRACTOR

CROSS REFERENCE TO RELATED APPLICATIONS

This application claims the benefit of priority to Japanese Patent Application No. 2017-048268 filed on Mar. 14, 2017 and is a Continuation Application of PCT Application No. PCT/JP2018/007842 filed on Mar. 1, 2018. The entire contents of each application are hereby incorporated herein by reference.

BACKGROUND OF THE INVENTION

1. Field of the Invention

The present invention relates to an extractor that includes a band pass filter and a band elimination filter.

2. Description of the Related Art

In recent years, wireless terminal devices such as cellular phones each have been demanded to support, using a single antenna, communications of different wireless frequency bands and different wireless systems, such as communication based on a cellular system and communication based on Wi-Fi® and GPS. To this end, an extractor in which band pass filter that enables a high frequency signal having a wireless carrier frequency to pass through and a band elimination filter that does not enable the high frequency signal having the wireless carrier frequency to pass through but enables a high frequency signal having a different wireless carrier frequency to pass through are combined together, is located immediately below an antenna for the wireless terminal device.

In general, for a band pass filter including a surface acoustic wave resonator, a method for partially eliminating electrode fingers of an IDT (InterDigital Transducer) defining the surface acoustic wave resonator, that is, causing the electrode fingers of the IDT electrode to be partially missing, in order to increase the sharpness of the pass band width and an end portion of the pass band of the filter, has been used (see, for example, Japanese Unexamined Patent Application Publication No. 11-163664).

The surface acoustic wave filter described in Japanese Unexamined Patent Application Publication No. 11-163664 is a ladder surface acoustic wave filter in which a series arm resonator and a parallel arm resonator that are defined by surface acoustic wave resonators are connected in a ladder configuration. In the surface acoustic wave filter described in Japanese Unexamined Patent Application Publication No. 11-163664, electrode fingers of an IDT electrode that is a surface acoustic wave resonator are partially eliminated in a periodic manner, so that a frequency difference Δfs between a resonant frequency frs and an anti-resonant frequency fas of a series arm resonator and a frequency difference Δfp between a resonant frequency frp and an anti-resonant frequency fap of a parallel arm resonator are able to be adjusted, and the steepness in an end portion of a pass band is thus able to be improved.

However, in a case where electrode fingers of an IDT electrode in a surface acoustic wave resonator that is a band pass filter are partially eliminated in order to increase the steepness in an end portion of a pass band of the band pass filter in an extractor, unwanted ripples are generated on a lower frequency side relative to the pass band of the band pass filter. Such unwanted ripples especially affect the lower frequency side relative to the pass band of the band pass filter in the pass band of the band elimination filter. Thus, a problem occurs in that insertion loss of the band elimination filter is degraded.

SUMMARY OF THE INVENTION

Preferred embodiments of the present invention provide extractors in each of which steepness in an end portion of a pass band of a band pass filter is increased and degradation of insertion loss of a band eliminator filter is reduced.

An extractor according to a preferred embodiment of the present invention includes a band pass filter that includes a plurality of surface acoustic wave resonators electrically connected in a ladder configuration and enables a high frequency signal of a first pass band to pass through; a band elimination filter that does not enable the high frequency signal of the first pass band to pass through but enables a high frequency signal of a second pass band different from the first pass band to pass through; and a common terminal to which the band pass filter and the band elimination filter are electrically connected. In the band pass filter, each of the plurality of surface acoustic wave resonators includes an IDT (InterDigital Transducer) electrode that includes a first busbar electrode, a second busbar electrode facing the first busbar electrode, a plurality of first electrode fingers connected, in parallel or substantially in parallel to one another with equal spaces or substantially equal spaces therebetween, to the first busbar electrode, and a plurality of second electrode fingers connected, in parallel or substantially in parallel to one another with equal spaces or substantially equal spaces therebetween, to the second busbar electrode. The first electrode fingers and the second electrode fingers alternate with one another. The plurality of surface acoustic wave resonators include at least one series arm resonator located at a series arm that electrically connects the common terminal with an input/output terminal and at least one parallel arm resonator located at a parallel arm that electrically connects the series arm with a ground. In the series arm, the IDT electrode in at least one of a first series arm resonator, out of the at least one series arm resonator, that is located at a position closest to the common terminal and a first parallel arm resonator, of the at least one parallel arm resonator, that is located at a parallel arm closest to the common terminal is a first IDT electrode in which neither the plurality of first electrode fingers nor the plurality of second electrode fingers is partially missing. The IDT electrode in at least one of the first series arm resonator or the first parallel arm resonator whose IDT electrode is not the first IDT electrode, a second series arm resonator, of the at least one series arm resonator, that is different from the first series arm resonator, and a second parallel arm resonator, of the at least one parallel arm resonator, that is different from the first parallel arm resonator is a second IDT electrode in which at least one of the plurality of first electrode fingers and the plurality of second electrode fingers is partially missing.

With the above features, in the ladder band pass filter, characteristics of the first series arm resonator and the first parallel arm resonator that are electrically connected to the positions closest to the band elimination filter largely affect insertion loss of the band elimination filter. Therefore, by providing an IDT electrode in at least one of the first series arm resonator and the first parallel arm resonator as the first IDT electrode, in the case where at least one of the first series arm resonator or the first parallel arm resonator that does not include the first IDT electrode, the second series arm resonator, and the second parallel arm resonator is provided as the second IDT electrode, generation of ripples in the pass band of the band elimination filter is able to be reduced.

Furthermore, by providing the IDT electrode in at least one of the first series arm resonator or the first parallel arm resonator that does not include the first IDT electrode as an IDT electrode, the second series arm resonator, and the second parallel arm resonator as the second IDT electrode, steepness in an end portion of the pass band of the band pass filter is able to be increased.

Therefore, in the extractor in which the band pass filter and the band elimination filter are combined, the steepness in the end portion of the pass band of the band pass filter is able to be increased, and degradation of the insertion loss of the band elimination filter is able to be reduced.

Furthermore, the first parallel arm resonator may be electrically connected between a series arm that electrically connects the first series arm resonator with the input/output terminal and the ground. The IDT electrode in the first series arm resonator may be the first IDT electrode.

Accordingly, in the ladder band pass filter that includes the first series arm resonator located at the series arm closest to the common terminal, characteristics of the first series arm resonator located at the series arm closest to the band elimination filter largely affect the insertion loss of the band elimination filter. Therefore, by providing the IDT electrode in at least the first series arm resonator as the first IDT electrode and providing the IDT electrode in at least one of a series arm resonator different from the first series arm resonator and a parallel arm resonator as the second IDT electrode, degradation of the insertion loss of the band elimination filter is able to be efficiently reduced, and the steepness in the end portion of the pass band of the band pass filter is able to be increased.

Furthermore, the IDT electrode in the first parallel arm resonator may be the first IDT electrode.

Accordingly, in the ladder band pass filter that includes the first series arm resonator located at the series arm closest to the common terminal, by providing the IDT electrodes of the first series arm resonator and the first parallel arm resonator that are located at the series arm and the parallel arm closest to the band elimination filter as first IDT electrodes and providing the IDT electrode in at least one of the second series arm resonator and the second parallel arm resonator as the second IDT electrode, degradation of the insertion loss of the band elimination filter is able to be further reduced, and the steepness in the end portion of the pass band of the band pass filter is able to be increased.

Furthermore, the first parallel arm resonator may be electrically connected between a series arm that electrically connects the common terminal with the first series arm resonator and the ground, and the IDT electrode in the first parallel arm resonator may be the first IDT electrode.

Accordingly, in the ladder band pass filter that includes the first parallel arm resonator that is electrically connected between the series arm closest to the common terminal and the ground, characteristics of the first parallel arm resonator that is located at the parallel arm closest to the band elimination filter largely affect the insertion loss of the band elimination filter. Therefore, by providing the IDT electrode in at least the first parallel arm resonator as the first IDT electrode and providing the IDT electrodes of a parallel arm resonator different from the first parallel arm resonator and a series arm resonator as the second IDT electrodes, degradation of the insertion loss of the band elimination filter is able to be efficiently reduced, and the steepness in the end portion of the pass band of the band pass filter is able to be increased.

Furthermore, the IDT electrode in the first series arm resonator may be the first IDT electrode.

Accordingly, in the ladder band pass filter that includes the first parallel arm resonator that is electrically connected between the series arm closest to the common terminal and the ground, characteristics of the first series arm resonator and the first parallel arm resonator that are located at the series arm and the parallel arm, respectively, closest to the band elimination filter largely affect the insertion loss of the band elimination filter. Therefore, by providing the IDT electrodes of the first series arm resonator and the first parallel arm resonator as the first IDT electrodes and providing the IDT electrode in at least one of the second series arm resonator and the second parallel arm resonator as the second IDT electrode, degradation of the insertion loss of the band elimination filter is able to be further reduced, and the steepness in the end portion of the pass band of the band pass filter is able to be increased.

Furthermore, in the second IDT electrode, at least one of the first electrode fingers and the second electrode fingers may be partially missing by being periodically omitted.

Accordingly, an extractor, in which the steepness in the end portion of the pass band of the band pass filter is able to be increased and the degradation of the insertion loss of the band elimination filter is able to be reduced, is able to be easily provided.

Furthermore, the second IDT electrode may include at least one of the first electrode fingers that are connected to the second busbar electrode in place of the first busbar electrode and the second electrode fingers that are connected to the first busbar electrode in place of the second busbar electrode.

Accordingly, at least one of the first electrode fingers connected to the first busbar electrode and the second electrode fingers connected to the second busbar electrode may be connected to the opposing second busbar electrode and first busbar electrode, respectively. Therefore, the pitch of electrode fingers does not largely change. Thus, the second IDT electrode is able to be easily provided without largely changing the pass band of the band pass filter. Therefore, an extractor, in which the steepness in the end portion of the pass band of the band pass filter is able to be increased and the degradation of the insertion loss of the band elimination filter is able to be reduced, is able to be easily provided.

Furthermore, the second IDT electrode may include a third electrode finger that is connected to neither the first busbar electrode nor the second busbar electrode.

Accordingly, at least one of the first electrode fingers connected to the first busbar electrode and the second electrode fingers connected to the second busbar electrode may be connected to neither the first busbar electrode nor the second busbar electrode. Therefore, the pitches of the first electrode fingers and the second electrode fingers are not largely changed. Thus, the second IDT electrode is able to be easily provided without largely changing the pass band of the band pass filter. Therefore, an extractor, in which the steepness in the end portion of the pass band of the band pass filter is able to be increased and the degradation of the insertion loss of the band elimination filter is able to be reduced, is able to be easily provided.

Furthermore, the second IDT electrode may include a fourth electrode finger that is defined by at least one of adjacent first electrode fingers of the plurality of first electrode fingers and adjacent second electrode fingers of the plurality of second electrode fingers that are integrally provided with each other.

Accordingly, the second IDT electrodes are provided by integrally providing adjacent first electrode fingers and second electrode fingers. Therefore, the second IDT electrodes are able to be easily provided without largely changing the design. Thus, an extractor in which the steepness, in the end portion of the pass band of the band pass filter is able to be increased and the degradation of the insertion loss of the band elimination filter is able to be reduced, is able to be easily provided.

Furthermore, the band elimination filter may include at least one inductance element and at least one capacitance element.

Accordingly, the band elimination filter that includes a predetermined elimination band and a predetermined pass band is able to be easily provided. Therefore, an extractor, in which the steepness in the end portion of the pass band of the band pass filter is able to be increased and the degradation of the insertion loss of the band elimination filter is able to be reduced, is able to be easily provided.

Furthermore, the capacitance element may be a surface acoustic wave resonator.

Accordingly, due to the surface acoustic wave resonator defining and functioning as the capacitance element, a capacitance element with different features does not need to be provided. Therefore, the extractor is able to be easily manufactured. Thus, an extractor, in which the steepness in the end portion of the pass band of the band pass filter is able to be increased and the degradation of the insertion loss of the band elimination filter is able to be reduced, is able to be easily provided.

Furthermore, the surface acoustic wave resonator and the capacitance element defining the band pass filter may be provided on a same piezoelectric substrate.

Accordingly, due to the surface acoustic wave resonator defining and functioning as the capacitance element for the band elimination filter, the band elimination filter and the band pass filter are able to be provided on the same substrate. Therefore, the extractor is able to be manufactured in a simplified process. Thus, an extractor, in which the steepness in the end portion of the pass band of the band pass filter is able to be increased and the degradation of the insertion loss of the band elimination filter is able to be reduced, is able to be easily provided.

With extractors according to preferred embodiments of the present invention, steepness in an end portion of the pass band of a band pass filter is able to be increased, and degradation of insertion loss of a band elimination filter is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
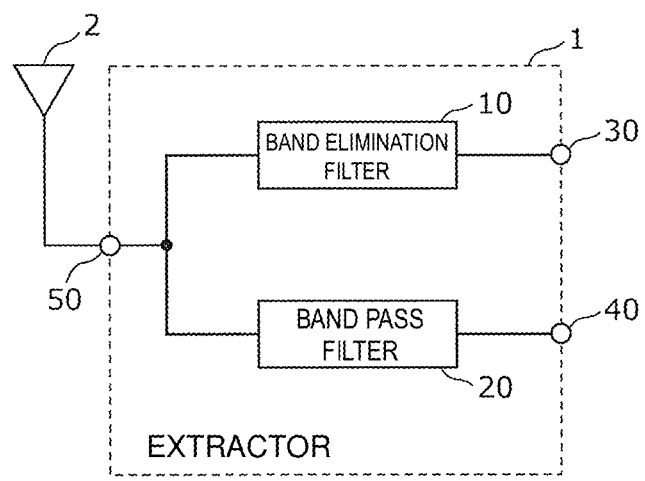
FIG. 1 is a schematic diagram of a communication device according to a first preferred embodiment of the present invention.

Hereinafter, preferred embodiments of the present invention will be explained in detail with reference to the drawings. The preferred embodiments described herein illustrate either general or specific examples. Numerical values, shapes, materials, components, and arrangements and structures of connection of the components described in the preferred embodiments are merely examples, and are not intended to limit the present invention. Components in the preferred embodiments, except those described in the independent claims, will be explained as optional components. The sizes or the ratios between the sizes of the components illustrated in the drawings are not strictly correct.

First Preferred Embodiment

1. Basic Features of Extractor

In a first preferred embodiment of the present invention, an example of a communication device that is able to support, using a single antenna, communication based on a cellular system and communication based on Wi-Fi® and GPS will be described.

Figure 2:
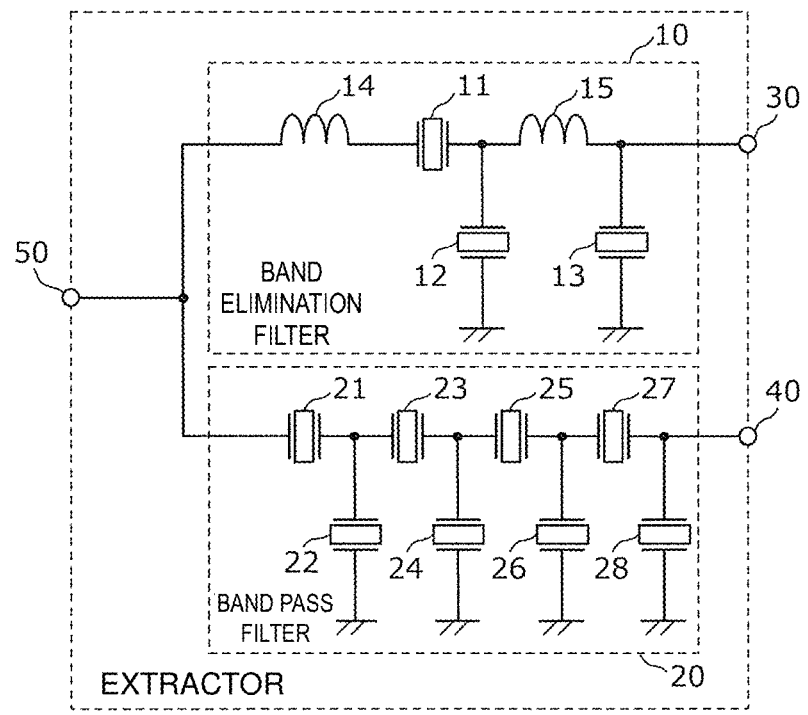
FIG. 2 is a circuit diagram of an extractor according to the first preferred embodiment of the present invention.

FIG. 1 is a schematic diagram of an extractor 1 according to the first preferred embodiment. FIG. 2 is a circuit diagram of the extractor 1 according to the first preferred embodiment.

As illustrated in FIGS. 1 and 2, the extractor 1 includes a band elimination filter 10, a band pass filter 20, input/output terminals 30 and 40, and a common terminal 50. The band elimination filter 10 and the band pass filter 20 are electrically connected to the common terminal 50. A terminal of the band elimination filter 10 that is opposite the common terminal 50 is electrically connected to the input/output terminal 30. A terminal of the band pass filter that is opposite the common terminal 50 is electrically connected to the input/output terminal 40. Furthermore, an antenna 2 is electrically connected to the common terminal 50.

The band pass filter 20 is a filter that enables a high frequency signal of a first frequency band to pass through. The first frequency band is preferably, for example, a frequency band that is used for communication based on Wi-Fi® and GPS.

The band elimination filter 10 is a filter that does not enable the high frequency signal of the first frequency band, which passes through the band pass filter 20, to pass through but enables a high frequency signal of a second frequency band, which does not pass through the band pass filter 20, to pass through. The second frequency band includes all of the frequency bands, except the first frequency band. The second frequency band is preferably, for example, a frequency band that is used for communication based on a cellular system.

The band elimination filter 10 includes, as illustrated in FIG. 2, inductance elements 14 and 15, a series arm resonator 11, and parallel arm resonators 12 and 13. The band pass filter 20 includes series arm resonators 21, 23, 25, and 27 and parallel arm resonators 22, 24, 26, and 28. The band pass filter 20 is a ladder filter in which the series arm resonators 21, 23, 25, and and the parallel arm resonators 22, 24, 26, and 28 are electrically connected in a ladder configuration.

In the band elimination filter 10, the series arm resonator 11 and the parallel arm resonators 12 and 13 are preferably, for example, surface acoustic wave resonators. Furthermore, in the band pass filter 20, the series arm resonators 21, 23, 25, and 27 and the parallel arm resonator 22, 24, 26, and 28 are preferably, for example, surface acoustic wave resonators. The details of the circuitry of the band elimination filter 10 and the band pass filter 20 will be described later.

2. Structure of Surface Acoustic Wave Resonator

A general structure of a surface acoustic wave resonator will be explained below.

Figure 3:
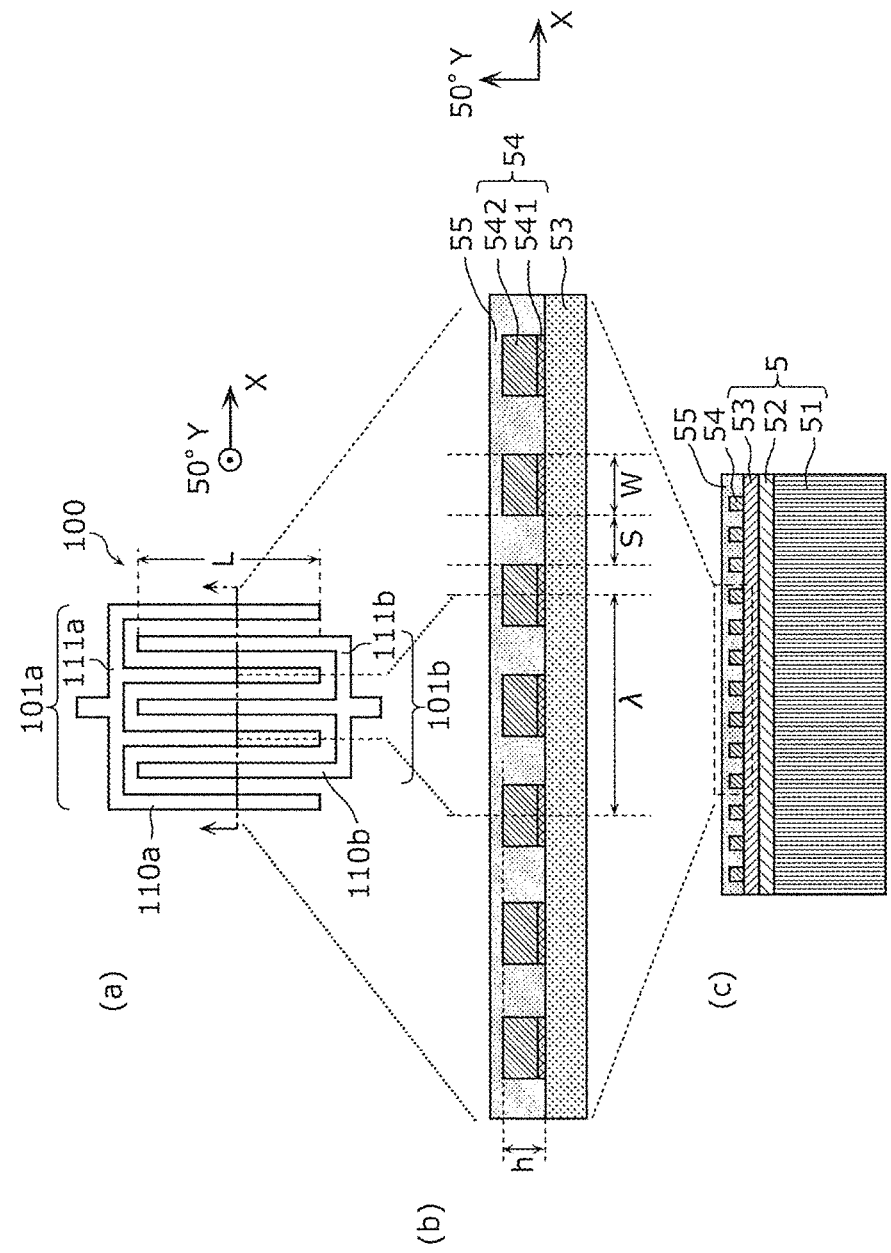
FIG. 3 includes schematic diagrams schematically illustrating a surface acoustic wave resonator, part (a) is a plan view, and parts (b) and (c) are cross-sectional views taken along the one-dotted chain line illustrated in part (a).

FIG. 3 includes schematic diagrams schematically illustrating an IDT electrode 100 that defines a surface acoustic wave resonator. Part (a) of FIG. 3 is a plan view, and parts (b) and (c) are cross-sectional views taken along a one-dotted chain line illustrated in part (a) of FIG. 3. In FIG. 3, examples of a plan schematic view and cross-sectional schematic views illustrating a structure of a surface acoustic wave are provided. The IDT electrode 100 in FIG. 3 is illustrated to explain a typical structure of an IDT electrode. The number and length of electrode fingers defining an IDT electrode are not limited to those explained below.

As illustrated in parts (a) to (c) of FIG. 3, the IDT electrode 100 includes a piezoelectric substrate 5 and comb-shaped electrodes 101a and 101b each having a comb shape.

As illustrated in part (a) of FIG. 3, the pair of the comb-shaped electrodes 101a and 101b, which face each other, are provided on the piezoelectric substrate 5. The comb-shaped electrode 101a includes a plurality of electrode fingers 110a that are parallel or substantially parallel to one another and a busbar electrode 111a that enables connection among the plurality of electrode fingers 110a. Furthermore, the comb-shaped electrode 101b includes a plurality of electrode fingers 110b that are parallel or substantially parallel to one another and a busbar electrode 111b that enables connection among the plurality of electrode fingers 110b. The plurality of electrode fingers 110a and 110b are provided along a direction orthogonal or substantially orthogonal to an X-axis direction.

Furthermore, a comb-shaped electrode 54 that includes the plurality of electrode fingers 110a and 110b and the busbar electrodes 111a and 111b includes a structure in which a close contact layer 541 and a main electrode layer 542 are laminated as illustrated in part (b) of FIG. 3.

The close contact layer 541 improves the close contact characteristics of the piezoelectric substrate 5 and the main electrode layer 542. For example, Ti is preferably included as a material of the close contact layer 541. The film thickness of the close contact layer 541 is preferably, for example, about 12 nm.

For example, Al containing about 1% of Cu is preferably included as a material of the main electrode layer 542. The film thickness of the main electrode layer 542 is preferably, for example, about 162 nm.

A protection layer 55 covers the comb-shaped electrodes 101a and 101b. The protection layer 55 protects the main electrode layer 542 from the external environment, adjusts frequency-temperature characteristics, and increases moisture resistance. The protection layer 55 is preferably, for example, a film containing silicon dioxide as a main component. The thickness of the protection layer 55 is preferably, for example, about 25 nm.

Materials included in the close contact layer 541, the main electrode layer 542, and the protection layer 55 are not limited to the materials described above. Furthermore, the comb-shaped electrode 54 may not include the lamination structure described above. The comb-shaped electrode 54 may include, for example, metal such as Ti, Al, Cu, Pt, Au, Ag, or Pd or an alloy thereof or may include a plurality of multilayer bodies including the metal or alloy mentioned above. Furthermore, the protection layer 55 may be omitted.

Furthermore, for example, the piezoelectric substrate 5 may include a structure in which an $LiTaO_3$ piezoelectric monocrystal or the like is included as a single layer or may include a structure in which a plurality of piezoelectric substrates or piezoelectric films is laminated.

Hereinafter, the piezoelectric substrate 5 will be explained with reference to an example of a piezoelectric substrate with a lamination structure.

As illustrated in part (c) of FIG. 3, the piezoelectric substrate 5 includes a high acoustic velocity support substrate 51, a low acoustic velocity film 52, and a piezoelectric film 53. The piezoelectric substrate 5 includes a structure in which the high acoustic velocity support substrate 51, the low acoustic velocity film 52, and the piezoelectric film 53 are laminated in this order.

The piezoelectric film 53 preferably includes, for example, 50° Y-cut, X-propagation $LiTaO_3$ piezoelectric monocrystal or piezoelectric ceramics (lithium tantalate monocrystal or ceramics which is cut along a plane whose normal is defined by an axis that is rotated around an X axis as a central axis by about 50 degrees from a Y axis and through which surface acoustic waves propagate in the X-axis direction). The piezoelectric film 53 preferably has a thickness of, for example, about 600 nm.

The high acoustic velocity support substrate 51 supports the low acoustic velocity film 52, the piezoelectric film 53, and the comb-shaped electrode 54. Furthermore, the high acoustic velocity support substrate 51 is a substrate in which the acoustic velocity of bulk waves therein is higher than that of surface acoustic waves or boundary acoustic waves propagating in the piezoelectric film 53. The high acoustic velocity support substrate 51 confines surface acoustic waves in a portion where the piezoelectric film 53 and the low acoustic velocity film 52 are laminated so that the surface acoustic waves do not leak below the high acoustic velocity support substrate 51. The high acoustic velocity support substrate 51 is preferably, for example, a silicon substrate and preferably has a thickness of, for example, about 200 µm.

The low acoustic velocity film 52 is a film in which the acoustic velocity of bulk waves therein is lower than that of bulk waves propagating in the piezoelectric film 53. The low acoustic velocity film 52 is located between the piezoelectric film 53 and the high acoustic velocity support substrate 51. Due to this structure and characteristics in which energy of acoustic waves, in its nature, are concentrated in a medium with a low acoustic velocity, energy of surface acoustic waves is prevented from leaking outside the comb-shaped electrode 54. The low acoustic velocity film 52 preferably contains, for example, silicon dioxide as a main component and preferably has a thickness of, for example, about 670 nm.

With the above-described lamination structure of the piezoelectric substrate 5, a Q value at a resonant frequency and an anti-resonant frequency is able to be significantly increased, compared to a conventional structure in which a piezoelectric substrate is provided as a single layer. That is, a surface acoustic wave resonator with a high Q value may be provided, and a filter with a low insertion loss is able to thus be defined by such a surface acoustic wave resonator.

Furthermore, in order to achieve impedance matching among a plurality of surface acoustic wave filters, circuit elements such as an inductance element and a capacitance element may be added at a path between the common terminal 50 and the antenna 2.

The high acoustic velocity support substrate 51 may include a structure in which a support substrate and a high acoustic velocity film in which the acoustic velocity of bulk waves propagating therein is higher than that of surface acoustic waves or boundary acoustic waves propagating in the piezoelectric film 53 are laminated. In this case, the support substrate may be a piezoelectric material such as lithium tantalate, lithium niobate, or crystal, various types of ceramics such as sapphire, alumina, magnesia, silicon nitride, aluminum nitride, silicon carbide, zirconia, cordierite, mullite, steatite, or forsterite, a dielectric such as glass, a semiconductor such as silicon or gallium nitride, a resin substrate, or the like, for example. Furthermore, the high acoustic velocity film may be made of various high acoustic velocity materials such as aluminum nitride, aluminum oxide, silicon carbide, silicon nitride, silicon oxynitride, a DLC film, diamond, a medium containing the above-described material as a main component, and a medium containing a mixture of the above-described materials as a main component.

Furthermore, in parts (a) and (b) of FIG. 3, λ represents a repetitive pitch of each of a plurality of electrode fingers 110a and 110b defining the comb-shaped electrodes 101a and 101b, respectively, L represents the cross width of each of the comb-shaped electrodes 101a and 101b, W represents the width of each of the electrode fingers 110a and 110b, S represents the width between the electrode fingers 110a and 110b, and h represents the height of each of the comb-shaped electrodes 101a and 101b. The ratio of the width W of each of the electrode fingers 110a and 110b to the width S between the electrode fingers 110a and 110b is defined as DUTY.

As described above, in the IDT electrode 100, the plurality of electrode fingers 110a and 110b are alternately arranged in parallel or substantially in parallel to one another. Therefore, electric charge is held between the individual electrode fingers of the plurality of electrode fingers 110a and 110b. Thus, the IDT electrode 100 may also define and function as a capacitance element.

3. Circuitry of Band Elimination Filter

Next, circuitry of the band elimination filter 10 will be explained.

As illustrated in FIG. 2, the band elimination filter 10 includes the inductance elements 14 and 15, the series arm resonator 11, and the parallel arm resonators 12 and 13.

Specifically, in the band elimination filter 10, at a series arm that electrically connects the common terminal 50 with the input/output terminal 30, the inductance element 14, the series arm resonator 11, and the inductance element 15 are provided in this order from a side closer to the common terminal 50. Furthermore, the parallel arm resonator 12 is electrically connected between the series arm that electrically connects the series arm resonator 11 with the inductance element 15 and the ground. The parallel arm resonator 13 is electrically connected between the series arm that electrically connects the inductance element 15 with the input/output terminal 30 and the ground.

The series arm resonator 11, the parallel arm resonator 12, and the parallel arm resonator 13 each define, for example, the IDT electrode 100 described above. In the band elimination filter 10, the series arm resonator 11, the parallel arm resonator 12, and the parallel arm resonator 13 define and function as capacitance elements. That is, the band elimination filter 10 includes an LC resonant circuit that includes at least one inductance element and one capacitance element.

The numbers of pairs of electrode fingers of the series arm resonator 11, the parallel arm resonator 12, and the parallel arm resonator 13 are preferably, for example, 230, 65, and 40, respectively. The cross widths of the series arm resonator 11, the parallel arm resonator 12, and the parallel arm resonator 13 are preferably, for example, about 40 µm, about 20 µm, and about 20 µm, respectively. The DUTY of each of the series arm resonator 11, the parallel arm resonator 12, and the parallel arm resonator 13 is preferably about 0.6, for example. The repetitive pitches λ of the series arm resonator 11, the parallel arm resonator 12, and the parallel arm resonator 13 are preferably, for example, about 1.611 µm, about 1.606 µm, and about 1.562 µm, respectively. The series arm resonator 11, the parallel arm resonator 12, and the parallel arm resonator 13 are not limited to the specific features described above and may be changed.

Furthermore, the inductance value of the inductance element 14 is preferably, for example, about 3.6 nH, and the inductance value of the inductance element 15 is preferably, for example, about 3.2 nH. The inductance values of the inductance element 14 and the inductance element 15 may be changed in accordance with a pass elimination band.

The band elimination filter 10 does not enable a high frequency signal of the first frequency band to pass through but enables a high frequency signal of the second frequency band to pass through.

The band elimination filter 10 does not necessarily include the features as described above. The band elimination filter 10 may include at least one inductance element and at least one capacitance element. For example, the band elimination filter 10 may have various configurations as long as at least one of an inductance element and a capacitance element is located at a series arm that electrically connects the common terminal 50 with the input/output terminal 30 and the other at least one of the inductance element and the capacitance element is located between the series arm that electrically connects the common terminal 50 with the input/output terminal 30 and the ground.

Furthermore, a surface acoustic wave resonator that uses surface acoustic waves may define and function as the capacitance element as described above, or an acoustic wave resonator that uses boundary acoustic waves or BAW (Bulk Acoustic Wave) may define and function as the capacitance element. Furthermore, a chip capacitor or a capacitance element defined by a conductor pattern of a high frequency substrate may define and function as the capacitance element. In the case where the capacitance element is an acoustic wave element, the acoustic wave element may be provided on the same piezoelectric substrate as that for the series arm resonators 21, 23, 25, and 27 and the parallel arm resonators 22, 24, 26, and 28 that define the band pass filter 20.

Furthermore, the inductance element may be a chip inductor or an inductance element defined by a conductor pattern of a high frequency substrate.

4. Circuitry of Band Pass Filter

Figure 4:
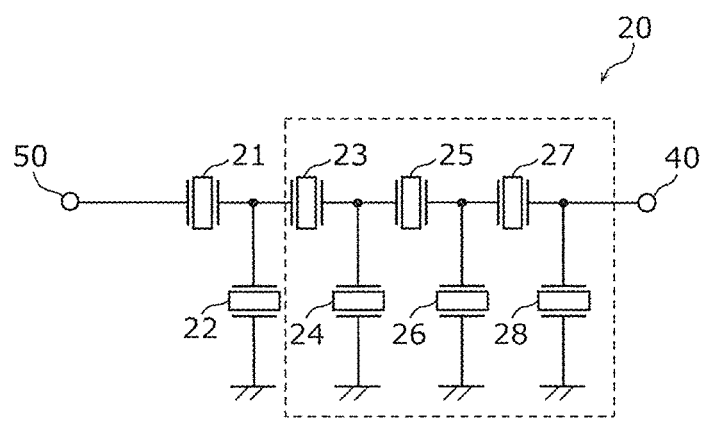
FIG. 4 is a circuit diagram of a band pass filter of the extractor according to the first preferred embodiment of the present invention.

Next, circuitry of the band pass filter 20 will be explained. FIG. 4 is a circuit diagram of the band pass filter 20 of the extractor 1 according to the first preferred embodiment.

As illustrated in FIGS. 2 and 4, the band pass filter 20 is a ladder filter in which the series arm resonators 21, 23, 25, and 27 and the parallel arm resonators 22, 24, 26, 28 are electrically connected in a ladder configuration.

Specifically, in the band pass filter 20, at a series arm that electrically connects the common terminal 50 with the input/output terminal 40, the series arm resonators 21, 23, 25, and 27 are provided in this order from a side closer to the common terminal 50. Furthermore, the parallel arm resonator 22 is electrically connected between the series arm that electrically connects the series arm resonator 21 with the series arm resonator 23 and the ground. The parallel arm resonator 24 is electrically connected between the series arm that electrically connects the series arm resonator 23 with the series arm resonator 25 and the ground. The parallel arm resonator 26 is electrically connected at a parallel arm that electrically connects the series arm that electrically connects the series arm resonator 25 with the series arm resonator 27, with the ground. The parallel arm resonator 28 is electrically connected between the series arm that electrically connects the series arm resonator 27 with the input/output terminal 40 and the ground. The series arm resonators 21, 23, 25, and 27 and the parallel arm resonators 22, 24, 26, and 28 are surface acoustic wave resonators.

In the band pass filter 20, the series arm resonator 21 that is located at the series arm closest to the common terminal 50 is a first series arm resonator. The parallel arm resonator 22 that is located at the parallel arm closest to the common terminal 50 is a first parallel arm resonator. Furthermore, the series arm resonators 23, 25, and 27, which are different from the series arm resonator 21, are second series arm resonators. The parallel arm resonators 24, 26, and 28, which are different from the parallel arm resonator 22, are second parallel arm resonators. The band pass filter 20 may have a configuration in which only one series arm resonator is provided, the series arm resonator is provided as the first series arm resonator, and no second series arm resonator is provided. Furthermore, the band pass filter 20 may have a configuration in which only one parallel arm resonator is provided, the parallel arm resonator is provided as a first parallel arm resonator and no second parallel arm resonator is provided.

An operating principle of a ladder surface acoustic wave filter will be explained below.

For example, resonant characteristics of each of the parallel arm resonators 22, 24, 26, and 28 illustrated in FIG. 4 represent a resonant frequency frp and an anti-resonant frequency fap (>frp). Furthermore, resonant characteristics of each of the series arm resonators 21, 23, 25, and 27 represent a resonant frequency frs and an anti-resonant frequency fas (>frs>frp). The resonant frequencies frs of the series arm resonators 21, 23, 25, and 27 are designed to be the same or substantially the same. However, the resonant frequencies frs of the series arm resonators 21, 23, 25, and 27 are not necessarily the same. Furthermore, the same or similar features apply to the anti-resonant frequencies fas of the series arm resonators 21, 23, 25, and 27, the resonant frequencies frp of the parallel arm resonators 22, 24, 26, and 28, and the anti-resonant frequencies fap of the parallel arm resonators 22, 24, 26, and 28. The anti-resonant frequencies fas of the series arm resonators 21, 23, 25, and 27 are not necessarily the same or substantially the same, the resonant frequencies frp of the parallel arm resonators 22, 24, 26, and 28 are not necessarily the same or substantially the same, and the anti-resonant frequencies fap of the parallel arm resonators 22, 24, 26, and 28 are not necessarily the same or substantially the same.

To provide a ladder surface acoustic wave filter as the band pass filter 20, the anti-resonant frequencies fap of the parallel arm resonators 22, 24, 26, and 28 are closer to each other, and the resonant frequencies frs of the series arm resonators 21, 23, 25, and 27 are closer to each other. Accordingly, frequencies near the resonant frequency frp at which the impedances of the parallel arm resonators 22, 24, 26, and 28 approach zero are defined as a lower-frequency-side elimination band. Furthermore, at frequencies higher than the lower-frequency-side elimination band, the impedances of the parallel arm resonators 22, 24, 26, and 28 increase in a region near the anti-resonant frequency fap and the impedances of the series arm resonators 21, 23, 25, and 27 approach zero in a region near the resonant frequency frs. Accordingly, frequencies near the anti-resonant frequency fap to the resonant frequency frs are defined as a signal pass band in a signal path from the common terminal 50 to the input/output terminal 40. Furthermore, when the frequency increases to a value near the anti-resonant frequency fas, the impedances of the series arm resonators 21, 23, 25, and 27 increase. Accordingly, frequencies near the anti-resonant frequency fas are defined as a higher-frequency-side elimination band. That is, the steepness of attenuation characteristics in the higher-frequency-side elimination band is largely affected by depending on where outside the signal pass band the anti-resonant frequencies fas of the series arm resonators 21, 23, 25, and 27 are to be set.

In the band pass filter 20, for example, when a high frequency signal is input from the common terminal 50, a potential difference occurs between the common terminal 50 and a reference terminal. Accordingly, the piezoelectric substrate 5 is distorted, and surface acoustic waves propagating in the X direction occur. By setting the repetitive pitch $\lambda$ of electrode fingers of the comb-shaped electrodes 101*a* and 101*b* and the wavelength of a pass band the same or substantially the same, only a high frequency signal containing a desired frequency component passes through the band pass filter 20. At this time, with at least one of electrode fingers of an IDT electrode in at least one of the series arm resonators 21, 23, 25, and 27 and the parallel arm resonators 22, 24, 26, and 28 being missing, the steepness of attenuation characteristics is able to be increased.

An IDT electrode 100 in which neither the plurality of electrode fingers 110a nor 110b defining the IDT electrode 100 is partially missing is referred to as a first IDT electrode, and an IDT electrode 100 in which at least one of the plurality of electrode fingers 110a and 110b is partially missing is referred to as a second IDT electrode.

A state in which an electrode finger is missing represents a state in which at least one electrode finger of the plurality of electrode fingers 110a and 110b defining the IDT electrode 100 is not provided. Furthermore, the state in which an electrode finger is missing is not limited to the state in which at least one electrode finger of the plurality of electrode fingers 110a and 110b is not provided, and includes electrode fingers provided in an arrangement that is different from that of the plurality of electrode fingers 110a and 110b that are periodically arranged. For example, as described later, at least one of the plurality of electrode fingers 110a connected to the busbar electrode 111a may be provided as an electrode finger that is connected to neither the busbar electrode 111a nor the busbar electrode 111b facing each other or may be provided as an electrode finger that is connected to the busbar electrode 111b. Furthermore, at least one of the plurality of electrode fingers 110a may be provided as an electrode finger that is integrally provided with an adjacent one of the plurality of electrode fingers 110a to fill the gap between the one of the plurality of electrode fingers 110a and the adjacent one of the plurality of electrode fingers 110a.

In the band pass filter 20 according to the first preferred embodiment, in the series arm resonators 23, 25, and 27 and the parallel arm resonators 24, 26, and 28, which are located in a region indicated by a broken line in FIG. 4, at least one of the electrode fingers 110a and 110b defining the IDT electrode 100 is partially missing as descried below.

Figure 5:
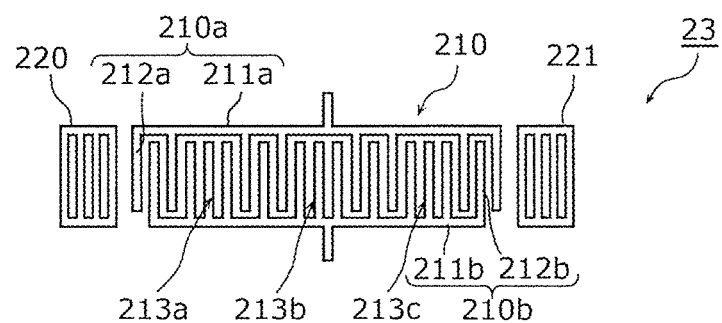
FIG. 5 is a schematic plan view illustrating an example of electrodes of a surface acoustic wave resonator in the band pas filter of the extractor according to the first preferred embodiment of the present invention.

FIG. 5 is a schematic plan view illustrating an example of electrodes of a surface acoustic wave resonator in the band pass filter 20 of the extractor 1. In FIG. 5, the series arm resonator 23 of the band pass filter 20 will be provided as an example.

As illustrated in FIG. 5, the series arm resonator 23 includes an IDT electrode 210 and reflectors 220 and 221. In the IDT electrode 210, a pair of comb-shaped electrodes 210a and 210b that face each other are provided. The comb-shaped electrode 210a includes a plurality of electrode fingers 212a that are parallel or substantially parallel to one another and a busbar electrode 211a that enables connection among the plurality of electrode fingers 212a. Furthermore, the comb-shaped electrode 210b includes a plurality of electrode fingers 212b that are parallel or substantially parallel to each other and a busbar electrode 211b that enables connection among the plurality of electrode fingers 212b.

Furthermore, the reflectors 220 and 221 are provided on both sides of a high frequency propagation direction of the IDT electrode 210 to sandwich the IDT electrode 210 therebetween.

In the IDT electrode 210, electrode fingers 213a, 213b, and 213c that are connected to the busbar electrode 211b, which faces the busbar electrode 211a, are provided in place of a portion of the plurality of electrode fingers 212a connected to the busbar electrode 211a. That is, in the series arm resonator 23, every third electrode finger of the electrode fingers 212a is missing from the busbar electrode 211a, and the electrode fingers 213a, 213b, and 213c connected to the busbar electrode 211b are provided instead. Two of the electrode fingers 212a and three of the electrode fingers 212b are located between the electrode finger 213a and the electrode finger 213b and between the electrode finger 213b and the electrode finger 213c.

As described above, the IDT electrode 210 of the series arm resonator 23 is a second IDT electrode in which the plurality of electrode fingers 212a are partially missing by being periodically omitted from the busbar electrode 211a and the electrode fingers 213a, 213b, and 213c are periodically provided instead.

Furthermore, as with the IDT electrode 210 illustrated in the series arm resonator 23, an IDT electrode in each of the series arm resonators 25 and 27 and the parallel arm resonators 24, 26, and 28 is a second IDT electrode in which a portion of the electrode fingers 212a and 212b is missing. In the series arm resonators 23, 25, and 27 and the parallel arm resonators 24, 26, and 28, a portion of the electrode fingers 212a and 212b is not necessarily missing on every third electrode finger basis. A portion of the electrode fingers 212a and 212b may be missing based on a different period. Furthermore, a portion of electrode fingers may be missing based on a different period or based on the same period between the series arm resonators 25 and 27 and the parallel arm resonators 24, 26, and 28. Furthermore, a portion of electrode fingers may be missing periodically or non-periodically.

Furthermore, in the band pass filter 20, IDT electrodes in the series arm resonator 21 and the parallel arm resonator 22, which are located outside the region indicated by the broken line in FIG. 4, are first IDT electrodes in which none of electrode fingers defining the IDT electrodes are missing.

The numbers of pairs of electrode fingers of the series arm resonators 21, 23, 25, and 27 are preferably, for example, 42, 69, 230, and 98, respectively. The cross width of each of the series arm resonators 21, 23, 25, and 27 is preferably, for example, about 20 µm. DUTY of each of the series arm resonators 21, 23, 25, and 27 is preferably, for example, 0.6. The repetitive pitches λ of the series arm resonators 21, 23, 25, and 27 are preferably, for example, about 1.575 µm, about 1.580 µm, about 1.591 µm, and about 1.573 µm, respectively.

Furthermore, the numbers of pairs of the parallel arm resonators 22, 24, 26, and 28 are preferably, for example, 203, 105, 166, and 80, respectively. The cross width of each of the parallel arm resonators 22, 24, 26, and 28 is preferably, for example, about 20 µm. DUTY of each of the parallel arm resonators 22, 24, 26, and 28 is preferably, for example, 0.6. The repetitive pitches X of the parallel arm resonators 22, 24, 26, and 28 are preferably, for example, about 1.635 µm, about 1.633 µm, about 1.638 µm, and about 1.634 µm, respectively.

An example of the numbers of pairs of electrode fingers of the series arm resonators 23, 25, and 27 and the parallel arm resonators 24, 26, and 28 described above represents the numbers of pairs of electrode fingers provided in a case where no electrode finger is missing. The series arm resonators 21, 23, 25, and 27 and the parallel arm resonators 22, 24, 26, and 28 may be changed in an appropriate manner. Furthermore, the period of missing of a portion of electrode fingers in each of the series arm resonators 23, 25, and 27 and the parallel arm resonators 24, 26, and 28 may be changed in an appropriate manner.

Furthermore, in the band pass filter 20, IDT electrodes in both the series arm resonator 21 and the parallel arm resonator 22 are not necessarily provided as first IDT electrodes. An IDT electrode in at least one of the series arm resonator 21 and the parallel arm resonator 22 may be provided as a first IDT electrode. For example, an IDT electrode in the series arm resonator 21 may be provided as a first IDT electrode, and an IDT electrode in the parallel arm resonator 22 may be provided as a second IDT electrode. Furthermore, an IDT electrode in the series arm resonator 21 may be provided as a second IDT electrode, and an IDT electrode in the parallel arm resonator 22 may be provided as a first IDT electrode.

5. High Frequency Transmission Characteristics of Extractor

Hereinafter, high frequency transmission characteristics of the extractor 1 according to the first preferred embodiment will be explained while comparing the high frequency transmission characteristics of the extractor 1 according to the first preferred embodiment with high frequency transmission characteristics of an extractor according to a comparative example.

In the extractor according to the comparative example, all of the IDT electrodes in the series arm resonators 21, 23, 25, and 27 and the parallel arm resonators 22, 24, 26, and 28 are provided as second IDT electrodes, compared with the extractor 1 according to the first preferred embodiment illustrated in FIG. 2.

Figure 6A:
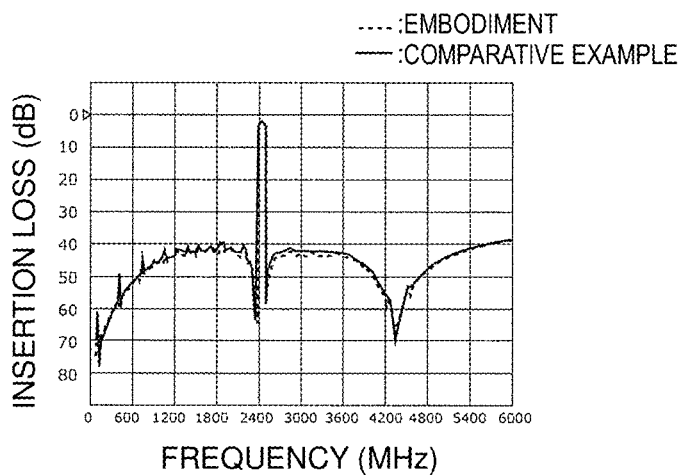
FIG. 6A is a graph illustrating a comparison between bandpass characteristics of band pass filters of extractors according to the first preferred embodiment of the present invention and a comparative example.
Figure 6B:
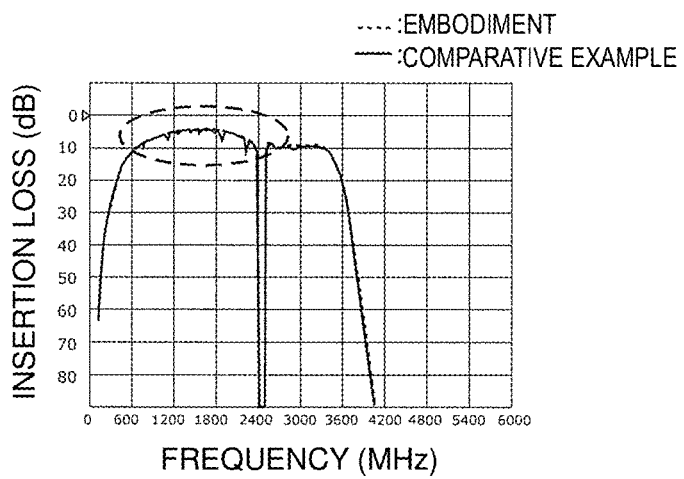
FIG. 6B is a graph illustrating a comparison between bandpass characteristics of band elimination filters of extractors according to the first preferred embodiment of the present invention and a comparative example.

FIG. 6A is a graph illustrating a comparison between bandpass characteristics of the band pass filter 20 according to the first preferred embodiment and bandpass characteristics of the band pass filter 20 according to the comparative example. FIG. 6B is a graph illustrating a comparison between bandpass characteristics of the band elimination filter 10 according to the first preferred embodiment and bandpass characteristics of the band elimination filter 10 according to the comparative example.

As is clear from FIG. 6A, compared to the band pass filter of the extractor according to the comparative example, in the band pass filter 20, insertion loss in a band other than the pass band is better than insertion loss of the band pass filter of the extractor according to the comparative example. In the band pass filter of the extractor according to the comparative example, a plurality of ripples are generated in the band other than the pass band of the band pass filter 20. This is because the IDT electrodes in the series arm resonators 21, 23, 25, and 27 and the parallel arm resonators 22, 24, 26, and 28 defining the band pass filter 20 are provided as the second IDT electrodes. In contrast, in the band pass filter 20 according to the first preferred embodiment, the IDT electrodes in the series arm resonator 21 and the parallel arm resonator 22 are provided as the first IDT electrodes, and the IDT electrodes of the series arm resonators 23, 25, and 27 and the parallel arm resonators 24, 26, and 28 are provided as the second IDT electrodes. Therefore, the insertion loss of the band pass filter 20 is overall reduced.

Furthermore, in the band elimination filter 10, generation of ripples is reduced, compared to the band elimination filter of the extractor according to the comparative example, as illustrated in a region surrounded by a broken thick line in FIG. 6B. In particular, it is clear that generation of ripples is reduced in a pass band on a lower frequency side relative to the elimination band of the band elimination filter 10. This is because the electrode fingers of the IDT electrodes in the series arm resonator 21 and the parallel arm resonator 22 that are provided on a side in the band pass filter 20 that is closer to the common terminal 50, that is, on a side closer to the band elimination filter 10, are provided as the first IDT electrodes. In the band pass filter 20, the series arm resonator 21 and the parallel arm resonator 22, which are provided on a side closer to the band elimination filter 10, largely affect the band elimination filter 10. Therefore, by providing the IDT electrodes in the series arm resonator 21 and the parallel arm resonator 22 as the first IDT electrodes and providing the IDT electrodes in the series arm resonators 23, 25, and 27 and the parallel arm resonators 24, 26, and 28 as the second IDT electrodes, influence of ripples generated at the band pass filter 20 on the band elimination filter 10 is able to be reduced.

6. Conclusion

As described above, the extractor 1 according to the first preferred embodiment includes the band pass filter 20 and the band elimination filter 10. In the band pass filter 20, the IDT electrodes in the series arm resonator 21 and the parallel arm resonator 22, which are located on a side closest to the common terminal 50, are provided as the first IDT electrodes in which none of the plurality of electrode fingers is missing, and the IDT electrodes of the series arm resonators 23, 25, and 27 and the parallel arm resonators 24, 26, and 28 are provided as the second IDT electrodes in which a portion of the plurality of electrode fingers is missing.

By providing the IDT electrodes in the series arm resonator 21 and the parallel arm resonator 22, which are located on a side closest to the common terminal 50, that is, at a position closest to the band elimination filter 10, as the first IDT electrodes, ripples generated in the elimination band on the lower frequency side in the band pass filter 20 by the series arm resonators 23, 25, and 27 and the parallel arm resonators 24, 26, and 28 provided as the second IDT electrodes may be prevented from affecting the band elimination filter 10. Therefore, no ripples are generated in the pass band of the band elimination filter 10, and degradation of the insertion loss of the band elimination filter 10 is able to be reduced. Consequently, in the extractor 1, the steepness in the band pass filter 20 is able to be increased, and degradation of the insertion loss of the band elimination filter 10 is able to be reduced.

In the first preferred embodiment described above, both the series arm resonator 21 and the parallel arm resonator 22 are provided as the first IDT electrodes in which none of the plurality of electrode fingers is missing. However, this arrangement is not necessarily provided. At least one of the series arm resonator 21 and the parallel arm resonator 22 may be provided as the first IDT electrode.

Furthermore, in the first preferred embodiment described above, the IDT electrodes in the series arm resonators 23, 25, and 27 and the parallel arm resonators 24, 26, and 28 are provided as the second IDT electrodes in which at least one of the plurality of electrode fingers is missing. However, this arrangement is not necessarily provided. At least one of the series arm resonators 23, 25, and 27 and the parallel arm resonators 24, 26, and 28 may have an electrode finger of an IDT electrode that is missing.

Furthermore, a state in which an electrode finger is missing may represent a state in which an electrode connected to a different busbar electrode that is opposite a busbar electrode to which the electrode is supposed to be connected in a related art is provided, as described above, or a state in which an electrode in which different features from that of the other electrode fingers arranged periodically is provided. Furthermore, IDT electrodes may include features as described in first to third modifications described below or other suitable features. Furthermore, regarding the second IDT electrodes, all of the series arm resonators 23, 25, and 27 and the parallel arm resonators 24, 26, and 28 may include the same features or different features.

First Modification of First Preferred Embodiment

Figure 7A:
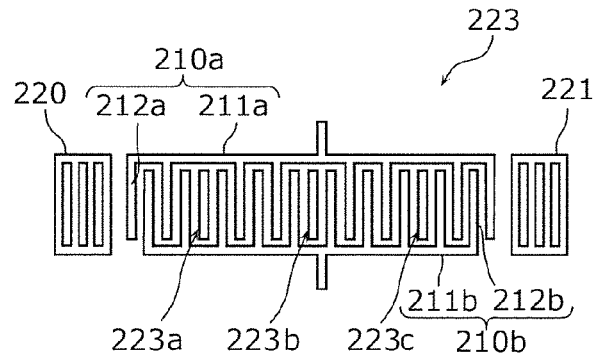
FIG. 7A is a schematic plan view illustrating an example of a second IDT electrode in a band pass filter of an extractor according to a first modification of the first preferred embodiment of the present invention.

FIG. 7A is a schematic plan view illustrating an example of a second IDT electrode in the band pass filter 20 of the extractor 1 according to a first modification of the first preferred embodiment.

As illustrated in FIG. 7A, as with the IDT electrode 210 in the series arm resonator 23 described in the first preferred embodiment, an IDT electrode 223 includes the comb-shaped electrode 210a including the busbar electrode 211a and the electrode fingers 212a and the comb-shaped electrode 210b including the busbar electrode 211b and the electrode fingers 212b.

The IDT electrode 223 includes electrode fingers 223a, 223b, and 223c, in place of a portion of the plurality of electrode fingers 212a connected to the busbar electrode 211a. The electrode fingers 223a, 223b, and 223c are third electrode fingers that are connected to neither the busbar electrode 211a nor the busbar electrode 211b. More specifically, the electrode fingers 223a, 223b, and 223c are provided such that every third electrode finger of the electrode fingers 212a, which are supposed to be connected to the busbar electrode 211a, is connected to neither the busbar electrode 211a nor the busbar electrode 211b.

In the band pass filter 20 of the extractor 1, also with IDT electrodes of the series arm resonators 23, 25, and 27 and the parallel arm resonators 24, 26, and 28 having the same or similar features as that of the IDT electrode 223 described above, the steepness in the band pass filter 20 is able to be increased, and degradation of the insertion loss of the band elimination filter 10 is able to be reduced.

Second Modification of First Preferred Embodiment

Figure 7B:
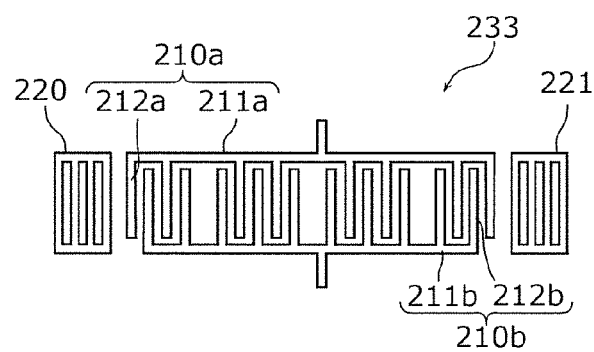
FIG. 7B is a schematic plan view illustrating another example of a second IDT electrode in a band pass filter of an extractor according to a second modification of the first preferred embodiment of the present invention.

FIG. 7B is a schematic plan view illustrating another example of a second IDT electrode in the band pass filter 20 of the extractor 1 according to a second modification of the first preferred embodiment.

As illustrated in FIG. 7B, as with the IDT electrode 210 of the series arm resonator 23 described in the first preferred embodiment, an IDT electrode 233 includes the comb-shaped electrode 210a including the busbar electrode 211a and the electrode fingers 212a and the comb-shaped electrode 210b including the busbar electrode 211b and the electrode fingers 212b.

The IDT electrode 233 does not include a portion of the plurality of electrode fingers 212a connected to the busbar electrode 211a. Specifically, for the busbar electrode 211a, every third electrode finger of the electrode fingers 212a is not present, and gaps are present. That is, in the IDT electrode 233, a portion of the plurality of electrode fingers 212a connected to the busbar electrode 211a is missing, and gaps are provided periodically.

In the band pass filter 20 of the extractor 1, also with the IDT electrodes of the series arm resonators 23, 25, and 27 and the parallel arm resonators 24, 26, and 28 having the same or similar features as that of the IDT electrode 233 described above, the steepness in the band pass filter 20 is able to be increased, and degradation of the insertion loss of the band elimination filter 10 is able to be reduced.

Third Modification of First Preferred Embodiment

Figure 7C:
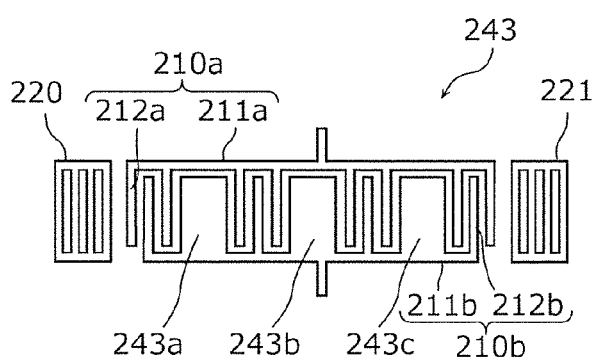
FIG. 7C is a schematic plan view illustrating another example of a second IDT electrode in a band pass filter of an extractor according to a third modification of the first preferred embodiment of the present invention.

FIG. 7C is a schematic plan view illustrating another example of a second IDT electrode in the band pass filter 20 of the extractor 1 according to a third modification of the first preferred embodiment.

As illustrated in FIG. 7C, compared to the IDT electrode 233 described in the second modification of the first preferred embodiment, the electrode fingers 212b that are adjacent to each other and connected to the busbar electrode 211b are integrally provided with each other in an IDT electrode 243.

Specifically, in the IDT electrode 243, every third electrode finger of the electrode fingers 212a is missing for the busbar electrode 211a, and fourth electrode fingers 243a, 243b, and 243c are connected to the busbar electrode 211b. The fourth electrode fingers 243a, 243b, and 243c are defined by adjacent electrode fingers 212b that are integrally provided with each other. That is, in the IDT electrode 243, a portion of the plurality of electrode fingers 212a connected to the busbar electrode 211a is missing, and the fourth electrode fingers 243a, 243b, and 243c that are defined by the adjacent electrode fingers 212b integrally provided with each other are connected periodically to the busbar electrode 211b.

In the band pass filter 20 of the extractor 1, also with the IDT electrodes of the series arm resonators 23, 25, and 27 and the parallel arm resonators 24, 26, and 28 having the same or similar features as the IDT electrode 243 described above, the steepness in the band pass filter 20 is able to be increased, and degradation of the insertion loss of the band elimination filter 10 is able to be reduced.

Second Preferred Embodiment

Next, an extractor according to a second preferred embodiment of the present invention will be explained. The extractor according to the second preferred embodiment is different from the extractor 1 according to the first preferred embodiment in the circuitry of a band pass filter 320.

Figure 8:
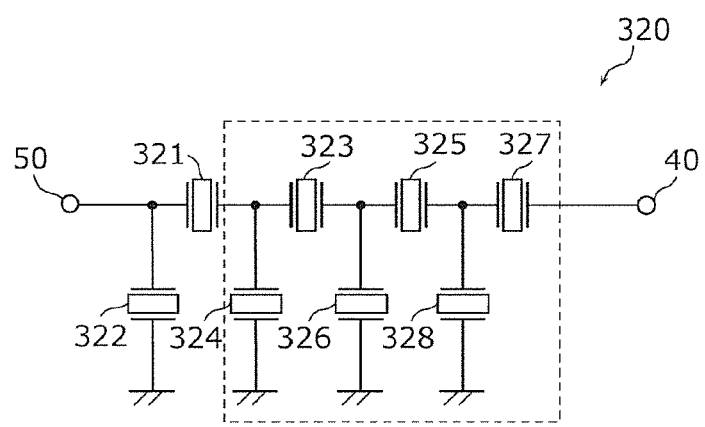
FIG. 8 is a circuit diagram of a band pass filter of an extractor according to a second preferred embodiment of the present invention.

FIG. 8 is a circuit diagram of the band pass filter 320 in the extractor 1 according to the second preferred embodiment.

As illustrated in FIG. 8, the band pass filter 320 is a ladder filter in which series arm resonators 321, 323, 325, and 327 and parallel arm resonators 322, 324, 326, and 328 are electrically connected in a ladder configuration.

Specifically, in the band pass filter 320, at a series arm that electrically connects the common terminal 50 with the input/output terminal 40, the series arm resonators 321, 323, 325, and 327 are provided in this order from a side closer to the common terminal 50. Furthermore, the parallel arm resonator 322 is electrically connected between the series arm that electrically connects the common terminal 50 with the series arm resonator 321 and the ground. The parallel arm resonator 324 is electrically connected between the series arm that electrically connects the series arm resonator 321 with the series arm resonator 323 and the ground. The parallel arm resonator 326 is electrically connected between the series arm that electrically connects the series arm resonator 323 with the series arm resonator 325 and the ground. The parallel arm resonator 328 is electrically connected between the series arm that electrically connects the series arm resonator 325 with the series arm resonator 237 and the ground. The series arm resonators 321, 323, 325, and 327 and the parallel arm resonators 322, 324, 326, and 328 are surface acoustic wave resonators.

In the band pass filter 320, the series arm resonator 321 that is located at the series arm closest to the common terminal 50 is a first series arm resonator, and the parallel arm resonator 322 that is located at the parallel arm closest to the common terminal 50 is a first parallel arm resonator. Furthermore, the series arm resonators 323, 325, and 327 except the series arm resonator 321 are second series arm resonators. The parallel arm resonators 324, 326, and 328 except the parallel arm resonator 322 are second parallel arm resonators.

IDT electrodes in the series arm resonator 321 and the parallel arm resonator 322 are first IDT electrodes in which none of a plurality of electrode fingers is missing. Furthermore, IDT electrodes in the series arm resonators 323, 325, and 327 and the parallel arm resonators 324, 326, and 328 that are located in a region indicated by a broken line in FIG. 8 are second IDT electrode fingers in which at least one of a plurality of electrode fingers is missing.

In the extractor 1, the steepness in the band pass filter 320 is able to be increased, and degradation of insertion loss of the band elimination filter 10 is able to be reduced.

In the band pass filter 320, the IDT electrodes of both of the series arm resonator 321 and the parallel arm resonator 322 are not necessarily first IDT electrodes, and an IDT electrode in at least one of the series arm resonator 321 and the parallel arm resonator 322 may be a first IDT electrode. Furthermore, IDT electrodes of all of the series arm resonators 323, 325, and 327 and the parallel arm resonators 324, 326, and 328 are not necessarily second IDT electrodes. An IDT electrode in at least one of the series arm resonator 321 or the parallel arm resonator 322 whose IDT electrode is not an IDT electrode, the series arm resonators 323, 325, and 327, and the parallel arm resonators 324, 326, and 328 may be a second IDT electrode.

For example, in a path between the common terminal 50 and the input/output terminal 40, the IDT electrode in the parallel arm resonator 322, which is electrically connected between the series arm closest to the common terminal 50 and the ground, may be provided as the first IDT electrode, the IDT electrode in the series arm resonator 321 may be provided as the second IDT electrode, and the IDT electrodes in the series arm resonators 323, 325, and 327, and the parallel arm resonators 324, 326, and 328 may be provided as the first IDT electrodes. Furthermore, the IDT electrodes in the series arm resonators 321, 323, 325, and 327 may be provided as the first IDT electrodes, the IDT electrode in the parallel arm resonator 322 may be provided as the second IDT electrode, and the IDT electrodes of the parallel arm resonators 324, 326, and 328 may be provided as the first IDT electrodes.

The extractors according to the preferred embodiments and modifications of the preferred embodiments of the present invention have been described above. However, the present invention is not limited to the foregoing preferred embodiments. For example, the modifications described below to the foregoing preferred embodiments are also included in the present invention.

For example, in the foregoing preferred embodiments, IDT electrodes of both of a series arm resonator that is located at the series arm closest to the common terminal and a parallel arm resonator that is located at the parallel arm closest to the common terminal are provided as the first IDT electrodes in which none of a plurality of electrode fingers is missing. However, the present invention is not limited to this specific configuration. At least one of the series arm resonator that is located at the series arm closest to the common terminal and the parallel arm resonator that is located at the parallel arm closest to the common terminal may be provided as the first IDT electrode.

Furthermore, in the foregoing preferred embodiments, a portion of electrode fingers of IDT electrodes in all of the series arm resonators and the parallel arm resonators other than the series arm resonator located at the series arm closest to the common terminal and the parallel arm resonator located at the parallel arm closest to the common terminal is missing. However, the present invention is not limited to this specific configuration. At least one of the series arm resonators and the parallel arm resonators other than at least one of the series arm resonator located at the series arm closest to the common terminal and including first IDT electrode fingers or the parallel arm resonator located at the parallel arm closest to the common terminal and including first IDT electrode fingers may be a second IDT electrode in which at least one of a plurality of electrode fingers is missing.

Furthermore, missing of an electrode finger of an IDT electrode may not be based on every third electrode finger basis and may be based on a different periodic basis. Furthermore, a period of missing of an electrode finger may be different or the same between a plurality of series arm resonators and a plurality of parallel arm resonators in which a portion of electrode fingers of IDT electrodes is missing. Furthermore, missing of an electrode finger may be periodically or non-periodically.

Furthermore, regarding the plurality of series arm resonators and the parallel arm resonators, the numbers of pairs, the cross widths L, DUTY, and the repetitive pitches λ of IDT electrodes may be appropriately changed.

Furthermore, a ladder filter defining a band pass filter may include a parallel arm resonator electrically connected between a series arm electrically connecting a common terminal with a series arm resonator closest to the common terminal and the ground or may include the parallel arm resonator not electrically connected between the series arm electrically connecting the common terminal with the series arm resonator closest to the common terminal and the ground.

Furthermore, in a band elimination filter, a surface acoustic wave resonator using surface acoustic waves or an acoustic wave resonator using boundary acoustic waves or BAW (Bulk Acoustic Wave) may define and function as a capacitance element. Furthermore, a chip capacitor or a capacitance element defined by a conductor pattern of a high frequency substrate may define and function as a capacitance element. In the case where the capacitance element is an acoustic wave element, the acoustic wave element may be provided on the same piezoelectric substrate as that for a series arm resonator and a parallel arm resonator defining a band pass filter. Furthermore, an inductance element may be a chip inductor or an inductance element defined by a conductor pattern of a high frequency substrate.

Furthermore, the extractor described above may include another band pass filter provided at the input/output terminal opposite the common terminal. Furthermore, the extractor described above may include a PA (power amplifier), an LNA (noise reduction amplifier), or the like provided at the input/output terminal opposite the common terminal.

The present invention may be widely used for a communication device such as, for example, a cellular phone including a front end circuit including an extractor that is able to support communications of different wireless frequency bands and different wireless systems, a transmission device, a reception device, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An extractor comprising:
a band pass filter that includes a plurality of surface acoustic wave resonators electrically connected in a ladder configuration and enables a high frequency signal of a first pass band to pass through;
a band elimination filter that does not enable the high frequency signal of the first pass band to pass through but enables a high frequency signal of a second pass band different from the first pass band to pass through; and
a common terminal to which the band pass filter and the band elimination filter are electrically connected; wherein
in the band pass filter, each of the plurality of surface acoustic wave resonators includes an IDT (InterDigital Transducer) electrode that includes a first busbar electrode, a second busbar electrode facing the first busbar electrode, a plurality of first electrode fingers connected, in parallel or substantially in parallel to one another with equal or substantially equal spaces therebetween, to the first busbar electrode, and a plurality of second electrode fingers connected, in parallel or substantially in parallel to one another with equal or substantially equal spaces therebetween, to the second busbar electrode;
the first electrode fingers and the second electrode fingers are alternately arranged with one another;
the plurality of surface acoustic wave resonators include at least one series arm resonator arranged at a series arm that electrically connects the common terminal with an input/output terminal and at least one parallel arm resonator arranged at a parallel arm that electrically connects the series arm with a ground;
in the series arm, the IDT electrode in at least one of a first series arm resonator, of the at least one series arm resonator, that is arranged at a position closest to the common terminal and a first parallel arm resonator, of the at least one parallel arm resonator, that is arranged at a parallel arm closest to the common terminal is a first IDT electrode in which neither the plurality of first electrode fingers nor the plurality of second electrode fingers are partially missing; and
the IDT electrode in at least one of the first series arm resonator or the first parallel arm resonator whose IDT electrode is not the first IDT electrode, a second series arm resonator, of the at least one series arm resonator, that is different from the first series arm resonator, and a second parallel arm resonator, of the at least one parallel arm resonator, that is different from the first parallel arm resonator is a second IDT electrode in which at least one of the plurality of first electrode fingers and the plurality of second electrode fingers is partially missing.

2. The extractor according to claim 1, wherein
the first parallel arm resonator is electrically connected between a series arm that electrically connects the first series arm resonator with the input/output terminal and the ground; and
the IDT electrode in the first series arm resonator is the first IDT electrode.

3. The extractor according to claim 2, wherein the IDT electrode in the first parallel arm resonator is the first IDT electrode.

4. The extractor according to claim 1, wherein
the first parallel arm resonator is electrically connected between a series arm that electrically connects the common terminal with the first series arm resonator and the ground; and
the IDT electrode in the first parallel arm resonator is the first IDT electrode.

5. The extractor according to claim 4, wherein the IDT electrode in the first series arm resonator is the first IDT electrode.

6. The extractor according to claim 1, wherein in the second IDT electrode, at least one of the first electrode fingers and the second electrode fingers is partially missing by being periodically omitted.

7. The extractor according to claim 1, wherein the second IDT electrode includes at least one of two or more of the first electrode fingers provided such that none of the second electrode fingers are disposed in the space therebetween and two or more of the second electrode fingers provided such that none of the first electrode fingers are disposed in the space therebetween.

8. The extractor according to claim 1, wherein the second IDT electrode includes a third electrode finger that is connected to neither the first busbar electrode nor the second busbar electrode.

9. The extractor according to claim 1, wherein the second IDT electrode includes a fourth electrode finger that is defined by at least one of adjacent first electrode fingers of the plurality of first electrode fingers and adjacent second electrode fingers of the plurality of second electrode fingers that are integrally provided with each other.

10. The extractor according to claim 1, wherein the band elimination filter includes at least one inductance element and at least one capacitance element.

11. The extractor according to claim 10, wherein the capacitance element is a surface acoustic wave resonator.

12. The extractor according to claim 11, wherein the capacitance element and the plurality of surface acoustic wave resonators included in the band pass filter are provided on a same piezoelectric substrate.

13. The extractor according to claim 1, wherein the band elimination filter includes at least two inductance elements.

14. The extractor according to claim 1, wherein the IDT electrode of each of the plurality of surface acoustic wave resonators is covered by a protection layer that includes silicon dioxide.

15. The extractor according to claim 1, further comprising a pair of reflectors provided on first and second sides of the IDT electrode in at least one of a first series arm resonator in a high frequency propagation direction of the IDT electrode.

16. The extractor according to claim 1, wherein
the IDT electrode of each of the plurality of surface acoustic wave resonators includes a structure in which a close contact layer and a main electrode layer are laminated;
the close contact layer includes Ti; and
the main electrode layer includes Cu.

17. The extractor according to claim 1, wherein the IDT electrode of each of the plurality of surface acoustic wave resonators is provided on a piezoelectric substrate.

18. The extractor according to claim 17, wherein the piezoelectric substrate includes a high acoustic velocity support substrate, a low acoustic velocity film, and a piezoelectric film laminated in this order.

19. The extractor according to claim 18, wherein
an acoustic velocity of bulk waves in the high acoustic velocity support substrate is higher than an acoustic velocity of surface acoustic waves or boundary acoustic waves propagating in the piezoelectric film; and
an acoustic velocity of bulk waves in the low acoustic velocity film is lower than an acoustic velocity of bulk waves propagating in the piezoelectric film.

* * * * *